United States Patent
Tertinek

(10) Patent No.: US 10,623,045 B2
(45) Date of Patent: Apr. 14, 2020

(54) RECEIVER AND A METHOD FOR REDUCING A DISTORTION COMPONENT WITHIN A BASEBAND RECEIVE SIGNAL

(71) Applicant: Intel IP Corporation, Santa Clara, CA (US)

(72) Inventor: Stefan Tertinek, Linz (AT)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/747,771

(22) PCT Filed: Jul. 28, 2016

(86) PCT No.: PCT/IB2016/054507
§ 371 (c)(1),
(2) Date: Jan. 26, 2018

(87) PCT Pub. No.: WO2017/037554
PCT Pub. Date: Mar. 9, 2017

(65) Prior Publication Data
US 2018/0219573 A1     Aug. 2, 2018

(30) Foreign Application Priority Data
Aug. 31, 2015    (DE) .......................... 10 2015 114 541

(51) Int. Cl.
*H03B 21/00*    (2006.01)
*H04B 1/403*    (2015.01)
(Continued)

(52) U.S. Cl.
CPC ............. *H04B 1/406* (2013.01); *H04B 1/005* (2013.01); *H04B 1/0475* (2013.01); *H04B 1/40* (2013.01); *H04L 27/10* (2013.01); *H03B 21/00* (2013.01)

(58) Field of Classification Search
CPC ........ H04B 1/525; H04B 1/0475; H04B 1/10; H04B 1/123; H04B 15/00; H04B 1/30;
(Continued)

(56) References Cited

U.S. PATENT DOCUMENTS

2004/0002323 A1\* 1/2004 Zheng .................... H03D 3/009
455/324
2005/0111601 A1\* 5/2005 Bock ..................... H04L 27/227
375/354
(Continued)

FOREIGN PATENT DOCUMENTS

DE      102013104485 A1    11/2014
EP           2860876 A1     4/2015
(Continued)

*Primary Examiner* — Eva Y Puente
(74) *Attorney, Agent, or Firm* — Kowert, Hood, Munyon, Rankin & Goetzel, P.C.

(57) ABSTRACT

A receiver for reducing a distortion component within a baseband receive signal is provided. The baseband receive signal is derived from a radio frequency signal. The receiver includes a signal generation unit configured to generate a local oscillator signal. The local oscillator signal comprises a first signal component having a first frequency related to a desired signal component of the radio frequency signal, and a second signal component having a second frequency related to a frequency of an interfering signal. The receiver further includes a mixer coupled to the signal generation unit. The mixer is configured to receive the local oscillator signal, wherein the mixer receives the local oscillator signal with the interfering signal.

21 Claims, 7 Drawing Sheets

(51) Int. Cl.
*H04B 1/40* (2015.01)
*H04B 1/00* (2006.01)
*H04B 1/04* (2006.01)
*H04L 27/10* (2006.01)

(58) Field of Classification Search
CPC .......... H04B 1/40; H04B 1/62; H04B 17/104; H04L 27/364; H04L 25/061; H04L 25/4902; H04L 25/4921; H04L 27/12; H04L 27/2331; H04L 27/32; H04L 27/34; H04L 27/3433; H03B 21/00
USPC .................... 375/219, 285, 354; 455/324, 78
See application file for complete search history.

(56) References Cited

U.S. PATENT DOCUMENTS

| | | |
|---|---|---|
| 2006/0160510 A1* | 7/2006 | Seppinen ............... H04B 17/20 455/232.1 |
| 2007/0087714 A1 | 4/2007 | Chang |
| 2009/0130994 A1 | 5/2009 | Zhuo et al. |
| 2011/0053537 A1 | 3/2011 | Nagaraj et al. |
| 2014/0169411 A1 | 6/2014 | Aunkofer et al. |
| 2014/0220908 A1* | 8/2014 | Loh .......................... H04B 1/40 455/78 |
| 2015/0180685 A1* | 6/2015 | Noest ................... H04B 1/0475 375/219 |
| 2016/0277046 A1* | 9/2016 | Pratt .................... H04B 1/0475 |
| 2017/0222687 A1* | 8/2017 | Wyville ................. H04B 1/525 |

FOREIGN PATENT DOCUMENTS

| | | |
|---|---|---|
| JP | 20010267993 A | 9/2001 |
| KR | 101413970 B1 | 6/2014 |

\* cited by examiner

RECEIVER AND A METHOD FOR REDUCING A DISTORTION COMPONENT WITHIN A BASEBAND RECEIVE SIGNAL

FIELD

Examples relate to mitigating distortions in a baseband receive signal which are related to undesired signal components in a received radio frequency signal. In particular, some examples relate to a receiver and a method for reducing a distortion component within a baseband receive signal. Some examples relate to a receiver and a method for determining a compensation component for a local oscillator signal supplied to a mixer within the receiver.

BACKGROUND

In communication devices where a transmit path and a receive path share the same antenna, an intermediate device (e.g. a duplexer) may be provided to connect the transmit path and the receive path to the antenna. For example, a duplexer may separate different frequency bands used for transmission and reception of radio frequency signals by means of frequency-selective filter elements. For example, a first frequency band may be used by the transmit path for transmitting radio frequency signals, whereas a second frequency band may be used by the receive path for receiving radio frequency signals. A distance between a frequency band for transmission and a frequency band for reception is called "duplex distance". For example, a duplex distance may be 30 MHz for Long Term Evolution (LTE) frequency band 17. In particular, the transmit path and the receive path may be operated simultaneously, i.e., in Frequency-Division Duplexing (FDD) mode.

A duplexer should provide an adequate rejection of signal components related to transmission within a frequency band for reception. However, when a transmission signal is provided to the duplexer, leakage to the frequency band used for signal reception may occur. Thus, an undesired leakage component may be caused in a receive signal and yield significant transmit power in the receive signal. Accordingly, a signal containing a desired receive signal component and the undesired leakage component may be provided to a subsequent receiver, which may even result with the desired receive signal component being unrecoverable.

For Carrier Aggregation (CA), a receiver may comprise a single receive path for each component carrier and multiple clock domains may be used in the receiver (e.g. a dedicated local oscillator signal for a mixer of the respective receive path). Due to intermixing of frequencies from the multiple clock domains, a spur may occur at the mixer of a receive path. A spur is an undesired signal component occurring in addition to the dedicated local oscillator signal at an input of the mixer (e.g. due to crosstalk between the receive paths). Depending on the chosen carrier frequencies, the spur may have a frequency which is similar to a frequency of the undesired leakage component. Accordingly, the mixer may down-mix the undesired leakage component to the baseband due to the spur. The down-mixed leakage component may overlap with the down-mixed desired receive signal component and degrade the Signal-to-Noise-Ratio (SNR) of the baseband receive signal.

Conventional approaches attempt to mitigate the above described effects by suppressing the undesired leakage component before they can reach the mixer. In order to achieve this, elaborate layout planning of the semiconductor circuit, high electrical isolation between the various electrical components, high attenuation of the duplexer or separate flexible Surface Acoustic Wave (SAW) filters which filter out the undesired leakage component may be used. However, these (additional) high quality analog components increase a required area on a semiconductor substrate and manufacturing costs. Hence, there may be a desire for improved reduction of distortion components within a baseband receive signal.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
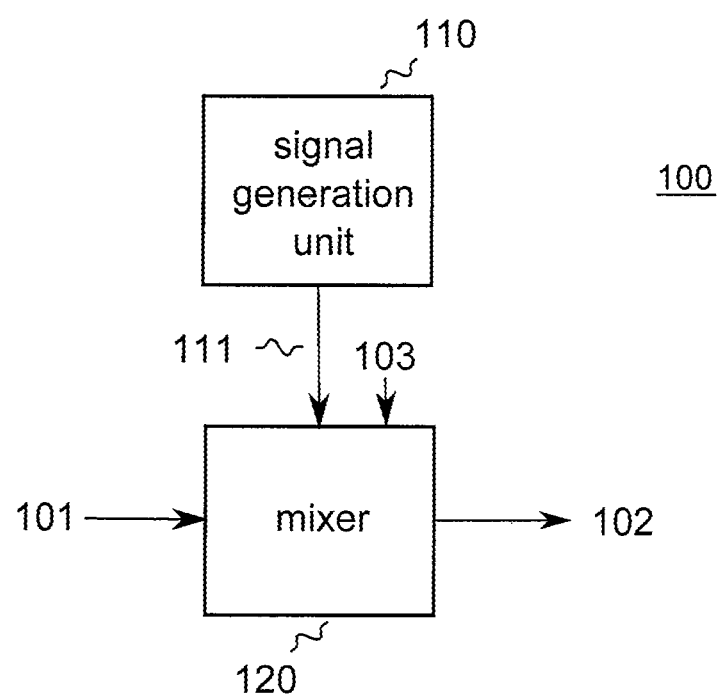
FIG. 1 illustrates an example of a receiver for reducing a distortion component within a baseband receive signal.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some examples thereof are shown by way of example in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of further examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art, unless expressly defined otherwise herein.

In the following, various examples relate to devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In some examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

FIG. 1 illustrates an example of a receiver 100 for reducing a distortion component within a baseband receive signal 102 derived from a Radio Frequency (RF) signal 101. The RF signal 101 comprises an undesired signal component (e.g. a blocker component or a leakage or crosstalk component caused by another signal) and a desired signal component (e.g. a desired downlink-component transmitted by a base-station).

A mixer 120 generates the baseband receive signal 101 using the RF signal 101 and a Local Oscillator (LO) signal 111. The LO signal 111 is generated by a signal generation unit 110. The LO signal 111 comprises a first signal component having a first frequency related to the desired signal component of the RF signal 101. For example, if the desired signal component is a modulated signal, the first frequency may be equal or similar to a carrier frequency of the desired signal component of the RF signal 101.

The mixer 120 is configured to receive an interfering signal 103 with the LO signal 111. In some examples, the interfering signal 103 may occur at the input of the mixer 120 due to crosstalk from other components of the receiver or external components (e.g. the interfering signal may originate from a second LO signal for a second mixer). In some examples, the interfering signal 103 may be an intermodulation product. For example, power supply and/or substrate coupling may cause intermodulation between the first signal component of the LO signal 111 and a further signal (e.g. another LO signal), so that apart from the first signal component and its harmonics additional (spurious) components comprising sum and difference frequencies of the first frequency and a frequency of the further signal are present at the input of the mixer 120.

In some examples, the interfering signal 103 may have a frequency which is similar to a frequency of the undesired signal component of the RF signal 101. For example, if the undesired signal component is a modulated transmit signal, the frequency of the interfering signal 103 may be equal or similar to a carrier frequency of the undesired signal component of the RF signal 101. Hence, the interfering signal 103 may cause the mixer 120 to down-mix the undesired signal component to the baseband. The baseband signal 102 may therefore have not only a desired component related to the desired signal component of the RF signal 101, but additionally a distortion component being related to the undesired signal component of the RF signal 101. Hence, a modulated spur may be generated in the baseband receive signal 102 due to the interfering signal 103. The undesired component, i.e. the modulated spur, of the baseband receive signal 102 may overlap with the desired component of the baseband receive signal 102, and hence degrade the SNR of the baseband receive signal 102.

In order to prevent a down-mixing of the undesired signal component of the RF signal 101 to the baseband, the signal generation unit 110 is configured to generate the LO signal 111 such that it comprises in addition to the first signal component a second signal component having a second frequency related to the frequency of the interfering signal 103. The second signal component may interfere with the interfering signal 103. For example, the second signal component may destructively interfere with the interfering signal 103, so that the mixer 120 effectively receives only the first signal component of the LO signal 111. For example, the second frequency may be equal to the frequency of the interfering signal 103. Accordingly, no additional signal component may be present at the input of the mixer 120 that can cause the mixer 120 to down-mix the undesired signal component of the RF signal 101 to the baseband. In other words, a clean LO signal may be provided to the mixer 120. Hence, the distortion component in the baseband receive signal 102, which is related to the undesired signal component of the RF signal 101, may be reduced or even completely prevented. The SNR of the baseband receive signal 102 may thus be increased compared to a situation where a local oscillation comprising merely the first signal component is supplied to the mixer 120.

In some examples, an amplitude of the second signal component may be related to an amplitude of the interfering signal 103. For example, the amplitude of the second signal component may be equal to the amplitude of the interfering signal 103. Adapting the amplitude of the second signal component may allow to generate the second signal component such that it can cancel out the interfering signal 103. Therefore, a phase of the second signal component may in some examples be related to a phase of the interfering signal 103. For example, the phase of the second signal component may be opposite to the phase of the interfering signal 103 (i.e. the phase of the second signal component is shifted by 180° compared to the phase of the interfering signal 103). Generating the second signal component of the LO signal 111 such that it comprises a same frequency and a same amplitude but an opposite phase compared to the interfering signal 103, may allow to cancel the interfering signal 103 at the input of the mixer 120 due to destructive interference between the second signal component and the interfering signal 103. Hence, the mixer 120 may effectively receive merely the first signal component of the LO signal 111, which is related to the desired signal component of the RF signal 111.

In some examples, the signal generation unit 110 may generate the LO signal 111 by modulating a reference signal comprising the first frequency with a reference tone, wherein the reference tone comprises the frequency of the interfering signal. For example, the reference signal may be generated by a LO or a Phase-Locked Loop (PLL). The signal generation unit 110 may, e.g., modulate a phase and/or an amplitude of the reference signal to generate a spurious sideband tone as the second signal component of the LO signal 111.

In some examples (e.g. for a transceiver comprising the receiver), the undesired signal component may be related to a RF transmit signal. For example, the RF transmit signal may leak into the receiver 100.

In some examples, the receiver 100 may be operable in at least two modes of operation. A second mode of operation may be the above described cancelling mode in order to cancel out the interfering signal 103. A first mode of operation may be a characterization mode, in which the receiver is configured to determine the second signal component. That is, in the first mode of operation, the receiver 100 may determine at least one of the second frequency, the phase of the second signal component and the amplitude of the second signal component.

In other words, the receiver illustrated in FIG. 1 may cancel the interfering (spurious) tone before it can down-mix a TX leakage signal. To do so, a compensation tone of the same frequency may be applied to modulate the amplitude and/or phase of a LO signal, generating a spurious sideband tone around the LO that will overlap with the interfering tone. The compensation tone may be adjusted until the sideband has the same amplitude but opposite phase as the interfering tone. Hence, both tones may cancel each other (destructive interference) and the mixer may receive a clean LO signal.

The receiver 100 may comprise one or more additional optional features corresponding to one or more aspects of the proposed concept or one or more examples described below. In particular, the receiver 100 may comprise one or more additional optional features relating to determining the second signal component described below (e.g. FIG. 3 or FIG. 4).

Generally speaking, some examples relate to a means for reducing a distortion component within a baseband receive signal derived from a RF signal. The means comprises a means for generating a LO signal. The LO signal comprises a first signal component having a first frequency related to a desired signal component of the RF signal, and a second signal component having a second frequency related to a frequency of an interfering signal. The means further comprises a means for receiving the LO signal. The means for receiving is coupled to the means for generating the LO signal, and receives the interfering signal (together) with the LO signal The means for reducing a distortion component may be implemented by a receiver for reducing a distortion component described above or below (e.g. FIG. 1). The means for generating a LO signal may be implemented by a signal generation unit described above or below (e.g. FIG. 1). The means for receiving the LO signal may be implemented by a mixer described above or below (e.g. FIG. 1).

Figure 2:
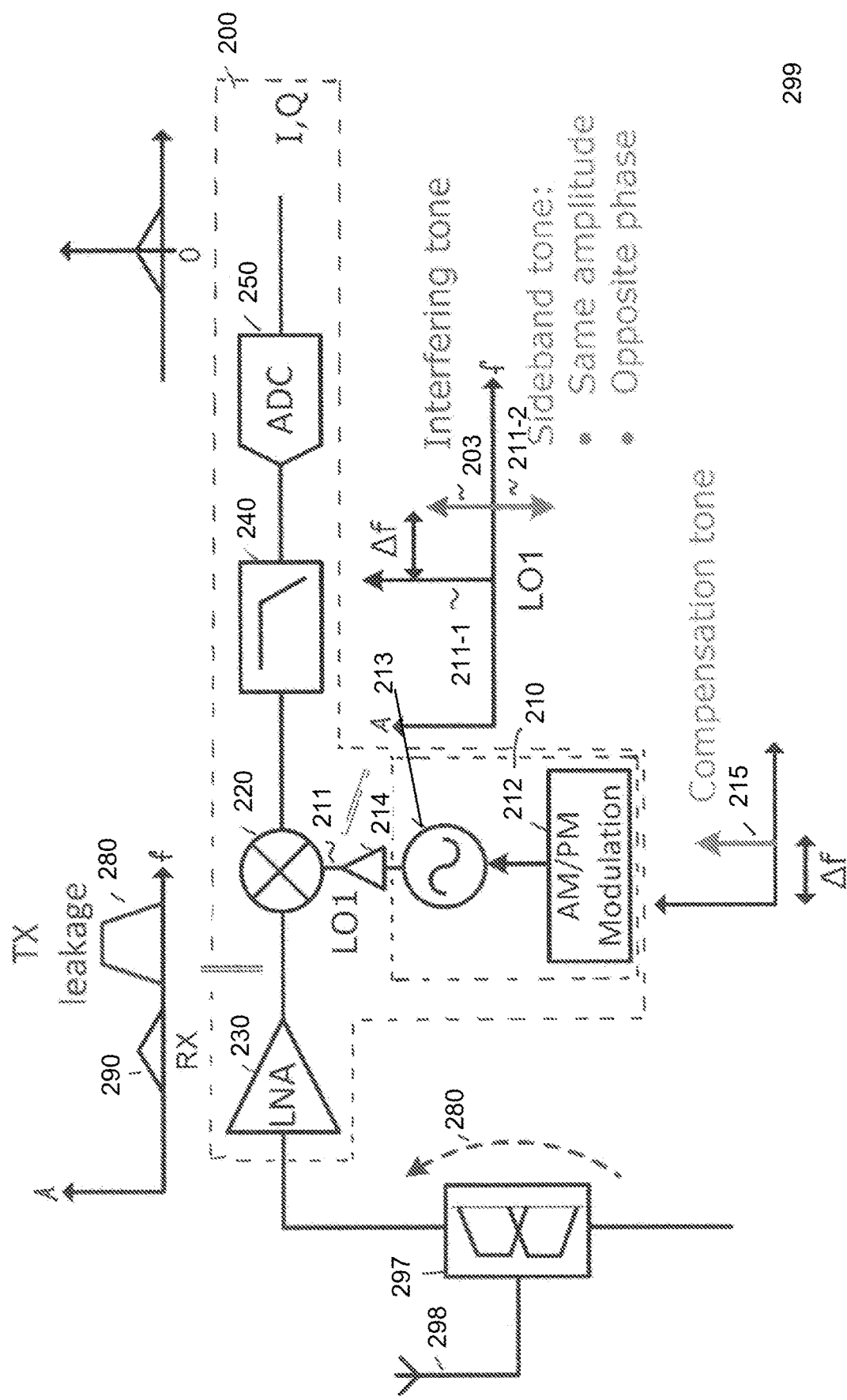
FIG. 2 illustrates an example of a transceiver comprising a receiver for reducing a distortion component within a baseband receive signal.

FIG. 2 illustrates an example of a transceiver 299 comprising a receiver 200. The receiver 200 is connected to an antenna 298 by means of a duplexer 297. The transmitter 299 further comprises a transmitter (not illustrated) connected to the antenna 298 via the duplexer 297.

The transmitter provides (supplies) a RF transmit signal to the duplexer 297. The duplexer 297 should provide an adequate rejection of signal components related to transmission (e.g. originating from the transmitter) within a frequency band for reception. However, the duplexer 297 may not provide infinite isolation between both frequency bands, so that part of the RF transmit signal may leak into the frequency band for reception. Accordingly, a leaked RF transmit signal 280 (TX leakage) may be provided to the receiver 200. In addition, the transceiver 299 receives a RF receive signal 290 (RX) via the antenna 298 and provides it to the receiver 200 via the duplexer 297. Accordingly, the receiver 200 is provided with a RF signal which comprises a desired signal component, i.e., the RF receive signal 290, and an undesired signal component, i.e., the leaked RF transmit signal 280.

The receiver 200 comprises a Low Noise Amplifier (LNA) 230, which may amplify a possibly weak RF signal while adding as little noise and distortion as possible to the signal. The amplified RF signal is provided to a first input of a mixer 220. At a second input, the mixer 220 is provided with a LO signal 211 having a first signal component 211-1, which is related to a frequency of the desired signal component of the RF signal. For example, the first frequency of the first signal component 211-1 is tuned to a carrier frequency of the RF receive signal 290. Accordingly, the RF receive signal 290 is down-mixed to the baseband by the mixer 220.

However, in addition to the first signal component 211-1, an interfering (spurious) signal 203 may be provided to the second input of the mixer 220. For example, the interfering signal 203 may be caused by an intermixing of frequencies generated within one or more other clock domains used within the transceiver 299. For example, the first signal component 211-1 of the LO signal 211 and a clock signal for the ADC 250 may intermix. The first signal component 211-1 of the LO signal 211 may, e.g., intermix with a LO signal used for up-mixing a baseband transmit signal in the transceiver 299's transmitter. In case the receiver 200 comprises additional receive paths, the first signal component 211-1 of the LO signal 211 may, e.g., intermix with a LO signal used for down-mixing a RF receive signal in one of the receive paths. In some examples, the interfering signal 203 may have a frequency which is similar or equal to a carrier frequency of the leaked RF transmit signal 280, i.e., of the undesired signal component of the received RF signal. Accordingly, the leaked RF transmit signal 280 might be down-mixed to the baseband by the mixer 220 using the interfering signal 203.

The analog baseband receive signal generated by the mixer 220 might thus comprise a desired baseband component related to the RF receive signal 290 and a distortion component related to the leaked RF transmit signal 280. Hence, the SNR of the analog baseband receive signal might be decreased due the distortion component.

The analog baseband receive signal is filtered by a low-pass filter 240 and converted to a digital signal by an Analog-to-Digital Converter (ADC) 250 in order to provide a digital baseband receive signal (e.g. in a Cartesian representation with an in-phase component I and a quadrature component Q).

In order to prevent down-mixing of the undesired signal component of the RF signal to the baseband, the signal generation unit 210 is configured to generate the LO signal 211 such that it comprises in addition to the first signal component 211-1 a second signal component 211-2 having a second frequency which is equal to the frequency of the interfering signal 203. In addition, the signal generation unit 210 is configured to provide the second signal component 211-2 such that an amplitude of the second signal component 211-2 is equal to an amplitude of the interfering signal 203, and such that a phase of the second signal component 211-2 is opposite to a phase of the interfering signal 203. The signal generation unit 210 therefore comprises a LO 213 to generate a reference signal comprising the first frequency. Additionally, the signal generation unit 210 comprises a modulator 212 to modulate a phase and/or an amplitude of the reference signal with a (compensation) tone 215 comprising the frequency of the interfering signal 203 in order to generate a spurious sideband, i.e., the second signal component 211-2. The compensation tone has a same frequency offset $\Delta f$ to the first frequency as the interfering signal 203. An amplifier 214 may amplify the LO signal 211 before it is supplied to the mixer 220.

Due to the above described characteristics of the second signal component 211-2, the second signal component 211-2 may destructively interfere with the interfering signal 203. Therefore, the mixer 220 may effectively receive only the first signal component 211-1 of the LO signal 211. Accordingly, no additional signal component may be present at the input of the mixer 220 that can cause the mixer 220 to down-mix the leaked RF transmit signal 280. Hence, a distortion component in the baseband receive signal, which is related to the leaked RF transmit signal 280, may be reduced or even completely prevented. The SNR of the baseband receive signal may thus be increased compared to a situation where a local oscillation comprising merely the first signal component 211-1 is supplied to the mixer 220.

In other words, the receiver illustrated in FIG. 2 may cancel the interfering tone before it can down-convert the TX leakage signal. As illustrated, the interfering tone may be present at the mixer input at an offset $\Delta f$ from the LO1 frequency. To cancel it, a compensation tone with the same frequency may be applied to modulate the LO1 amplitude and/or phase, producing a spurious sideband tone that overlaps with the interfering tone. The modulation may be configured such that the sideband tone has the same frequency and amplitude but opposite phase as the interfering tone. Hence the two tones may cancel each other which prevents the TX leakage from being down-converted.

The receiver 200 may comprise one or more additional optional features corresponding to one or more aspects of the proposed concept or one or more examples described below.

Figure 3:
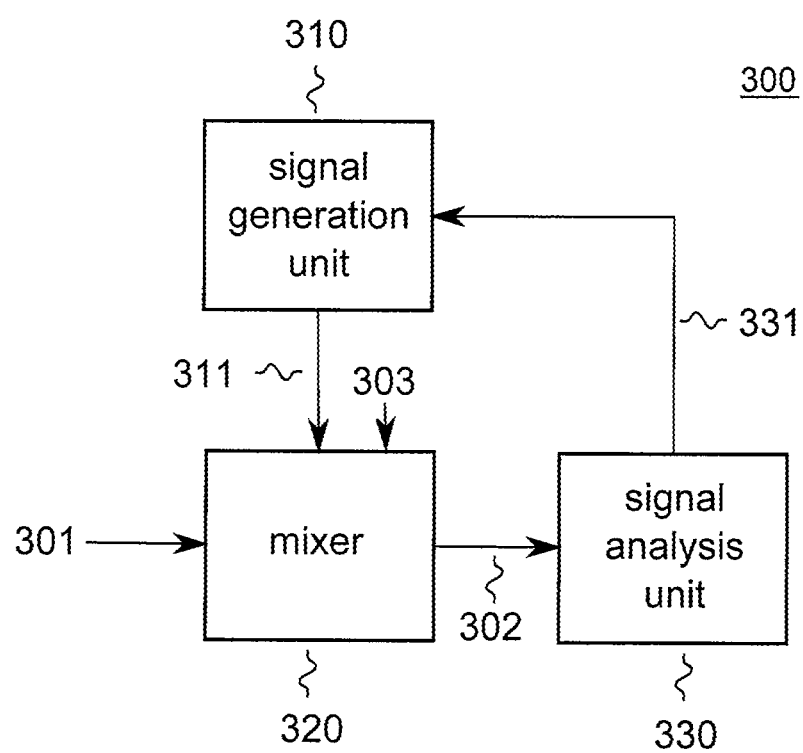
FIG. 3 illustrates an example of a receiver for determining a compensation component for a local oscillator signal supplied to a mixer within the receiver.

FIG. 3 illustrates an example of a receiver 300 for determining a compensation component for a LO signal 311 supplied to a mixer 320 within the receiver 300. The LO signal 111 is generated by a signal generation unit 310.

The mixer 320 receives a RF signal 301 having a first frequency. The mixer 320 generates a baseband signal 302 using the RF signal 301 and the LO signal 311. Therefore, signal generation unit 310 generates the LO signal 311 such that it comprises a first signal component having a frequency related to the first frequency. For example, the frequency of the first signal component may be (substantially) equal to the first frequency.

Together with the LO signal 311, the mixer 320 receives an interfering signal 303. In some examples, the interfering signal 303 may occur at the input of the mixer 320 due to crosstalk from other components of the receiver or external components (e.g. the interfering signal may originate from a second LO signal for a second mixer). In some examples, the interfering signal 303 may be an intermodulation product. For example, power supply and/or substrate coupling may cause intermodulation between the first signal component of the LO signal 311 and a further signal (e.g. another LO signal), so that apart from the first signal component and its harmonics additional (spurious) components comprising sum and difference frequencies of the first frequency and a frequency of the further signal are present at the input of the mixer 320.

The interfering signal 303 may cause the mixer 320 to generate an undesired signal component of the baseband signal 302 in addition to a desired signal component generated by down-mixing the RF signal 301 using the first signal component of the LO signal 311.

In order to prevent the generation of the undesired signal component, the signal generation unit 311 generates the LO signal 311 such that it comprises in addition to the first signal component a compensation component. The compensation component has a second frequency related to a frequency of the interfering signal. For example, the second frequency may be (substantially) equal to the frequency of the interfering signal 303. The compensation component may interfere with the interfering signal 303. For example, the compensation component may destructively interfere with the interfering signal 303, so that the mixer 320 effectively receives only the first signal component of the LO signal 311.

The receiver 300 comprises a signal analysis unit 330. The signal analysis unit 330 calculates a value 331 of a signal characteristic of the baseband signal in a frequency range corresponding to the undesired signal component of the baseband signal 302. For example, the signal characteristic may be the energy in the frequency range, so that the analysis unit 330 may calculate the energy of the undesired signal component of the baseband signal 302. The calculated value 331 of the signal characteristic represents the resulting distortion component which is generated by the mixer 320. Accordingly, the value 331 of the signal characteristic is an indicator for the effective distortion that is received by the mixer 320 together with the first component of the LO signal 311. That is, the value 331 of the signal characteristic is an indicator for the degree of destructive interference between the interfering signal 303 and the compensation component of the LO signal 311.

The signal generation unit 310 is therefore further configured to adjust a phase and/or an amplitude of the compensation component based on the value 331 of the signal characteristic. For example, the signal analysis unit 330 may supply the value 331 of the signal characteristic to the signal generation unit 310. For example, the signal generation unit 310 may adjust the amplitude of the compensation component to be equal to an amplitude of the interfering signal 303. Additionally or alternatively, the signal generation unit 310 may adjust the phase of the compensation component to be opposite (i.e. shifted by 180° compared) to a phase of the interfering signal 303. The compensation component may hence destructively interfere with interfering signal 303, so that the mixer 320 effectively receives only the first signal component of the LO signal 311. Accordingly, the distortion component of the baseband signal may thus be reduced or completely mitigated.

In some examples, the signal generation unit 310 may therefore be configured to adapt the phase and/or the amplitude of the compensation component iteratively until the value 331 of the signal characteristic satisfies a quality criterion. For example, the quality criterion may be that the value 331 of the signal characteristic is below a pre-defined threshold. If the signal characteristic is the energy of the baseband signal 302, the energy in the analyzed frequency range may be below a certain threshold energy. Accordingly, appropriate settings for the compensation component of the LO signal 311 may be determined in order to minimize the amount of the interfering signal 303 that is effectively received by the mixer 320 together with the first signal component of the LO signal 311.

In some examples, the signal generation unit 310 may generate the LO signal 311 by modulating a reference signal comprising the first frequency with a reference tone comprising the frequency of the interfering signal. For example, the reference signal may be generated by a LO or a PLL. The signal generation unit 310 may, e.g., modulate a phase and/or an amplitude of the reference signal to generate a spurious sideband tone as the compensation component of the LO signal 311.

In some examples, the RF signal 301 may be the reference signal. This configuration may be an energy and space saving implementation since the reference signal is used for both, as RF signal 301 and for generating the LO signal 311.

In some examples, where the interfering signal 303 is related to a second LO signal for another mixer (e.g. of another receive path or a transmit path if the receiver 300 is part of a transceiver), the receiver 300 may further determine the frequency of the interfering signal 303. Therefore, the signal analysis unit may be configured to calculate a frequency of a potentially interfering signal according to an operation which is mathematically correspondent to $$f_{int}=f_{LO1}+(n \cdot f_{LO1}-m \cdot f_{LO2}) \quad (1),$$

with $f_{int}$ denoting the frequency of the potentially interfering signal, $f_{LO1}$ denoting the frequency of the first signal component, $f_{LO2}$ denoting the frequency of the second LO signal, and n, m denoting integers. The signal analysis unit may hence calculate the frequencies potential intermixing products between the first signal component of the LO signal 311 and the second LO signal.

For determining the frequency of the interfering signal 303, the signal generation unit may be configured to generate an auxiliary LO signal comprising only the first signal component. The mixer 320 may use the RF signal 301 and the auxiliary LO signal to generate an auxiliary baseband signal.

The signal analysis unit 330 may calculate (determine) a value of the signal characteristic of the auxiliary baseband signal in a frequency range related to the frequency of the potentially interfering signal. The frequency of a distortion component in the auxiliary baseband signal is related to the frequency difference between the frequency of the RF signal 301 and the frequency of the interfering signal 303 actually present at the mixer 320. Therefore, an interesting frequency range for determining the value of the signal characteristic is related to the frequency of the potentially interfering signal. Hence, the value of the signal characteristic may indicate if the suspected potential interfering signal is equal to the interfering signal 303 actually present at the input of the mixer 320.

The signal analysis unit 330 may, based on the value of the signal characteristic in the frequency range related to the frequency of the potentially interfering signal, decide that the frequency of the potentially interfering signal is the frequency of the interfering signal 303. For example, the calculated value of the signal characteristic in the frequency range related to the frequency of the potentially interfering signal may be compared to a threshold value. If the value of the signal characteristic is above the threshold value, the signal analysis unit 330 may, e.g., decide that the frequency of the potentially interfering signal is the frequency of the interfering signal 303. If the value of the signal characteristic is below the threshold value, the signal analysis unit 330 may, e.g., decide that the frequency of the potentially interfering signal is not the frequency of the interfering signal 303.

If the signal analysis unit 330 decides that the frequency of the potentially interfering signal is the frequency of the interfering signal 303, the receiver 330 may use this information to adjust the frequency of the compensation component of the LO signal 311 to a frequency related to the frequency of the potentially interfering signal (e.g. to an equal frequency) and proceed with the above described adjustment of the amplitude and/or phase of the compensation component. If the signal analysis unit 330 decides that the frequency of the potentially interfering signal is not the frequency of the interfering signal 303, a frequency of another potentially interfering signal may be calculated according to equation (1) and the remaining process may be repeated for the other potentially interfering signal. In some examples, the receiver 300 may carry out the determination of the frequency of the interfering signal 303 iteratively until a potentially interfering signal is identified as the interfering signal 303.

The receiver 300 may comprise one or more additional optional features corresponding to one or more aspects of the proposed concept or one or more examples described below.

In some examples, the above described determination of the compensation component for the LO signal may be carried out, in a second mode of operation, by a receiver for reducing a distortion component within a baseband receive signal derived from a RF signal described herein. For example, the receiver 100 illustrated in FIG. 1 or the receiver 200 illustrated in FIG. 2 may use the above described determination of the compensation component for determining the second signal component of the LO signal 111, 211.

Generally speaking, some examples relate to a means for determining a compensation component for a LO signal supplied to a mixer within a receiver. The mixer receives an interfering signal with the LO signal. Further, the mixer is configured to receive a RF signal having a first frequency. The means comprises a means for generating the LO signal. The LO signal comprises a first signal component having a frequency related to the first frequency, and the compensation component having a second frequency related to a frequency of the interfering signal. The mixer is configured to generate a baseband signal using the RF signal and the LO signal. The means further comprises a means for calculating a value of a signal characteristic of the baseband signal in a frequency range corresponding to an undesired signal component of the baseband signal. The means for generating the LO signal is configured to adjust a phase and/or an amplitude of the compensation component based on the value of the signal characteristic.

The means for determining a compensation component for a LO signal supplied to a mixer within a receiver may be implemented by a receiver for determining a compensation component for a LO signal supplied to a mixer within a receiver described above or below (e.g. FIG. 3). The means for generating a LO signal may be implemented by a signal generation unit described above or below (e.g. FIG. 3). The means for calculating a value of a signal characteristic may be implemented by a signal analysis unit described above or below (e.g. FIG. 3).

Figure 4:
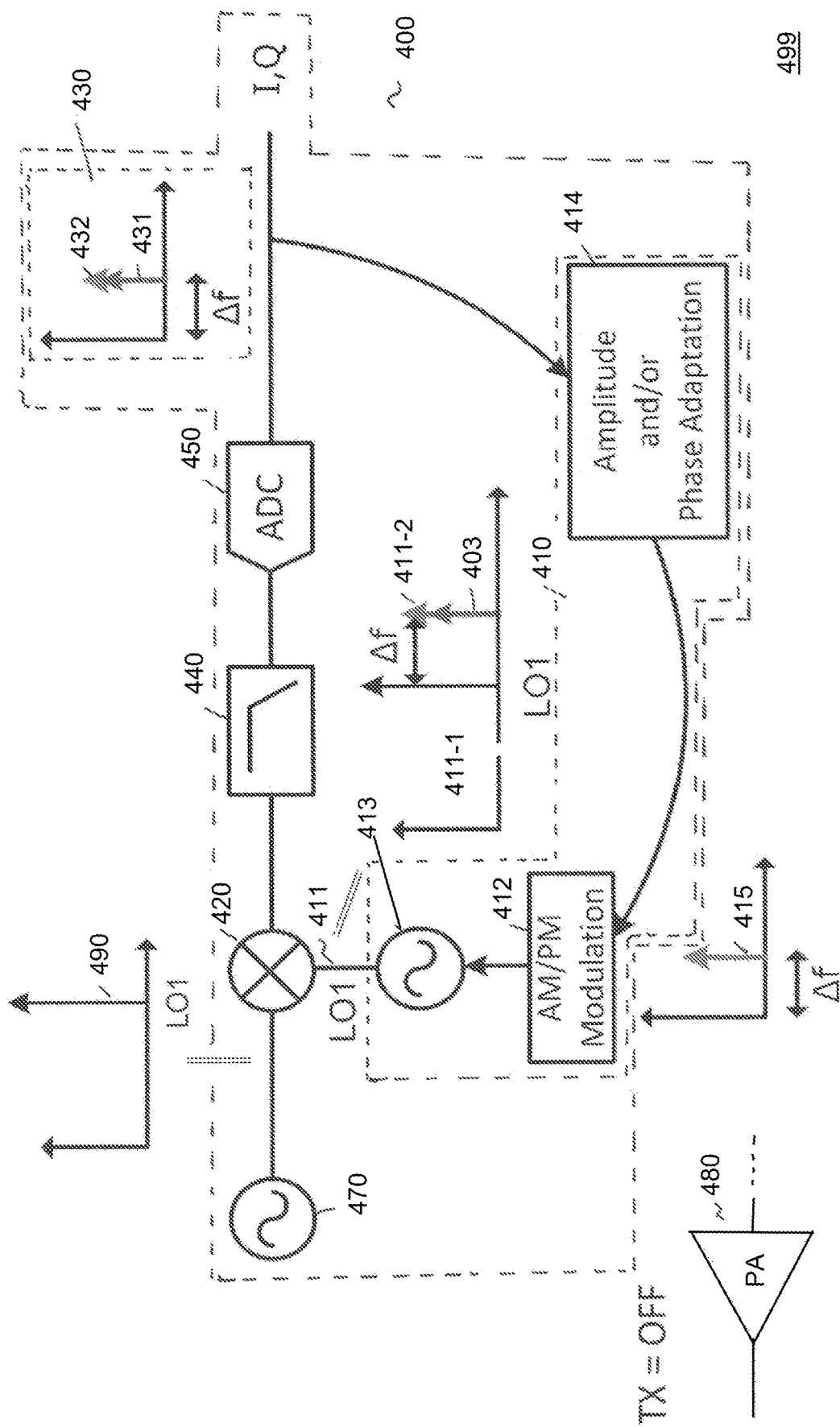
FIG. 4 illustrates an example of a transceiver comprising a receiver for determining a compensation component for a local oscillator signal supplied to a mixer within the receiver.

FIG. 4 illustrates an example of a transceiver 499 comprising a receiver 400. The transceiver 499 further comprises a transmitter 480. In the situation illustrated in FIG. 4, the transmitter 480 is de-activated, i.e., turned off. For example, the receiver 400 and the transmitter 480 may be connected to an antenna (not illustrated) by means of a duplexer (not illustrated).

The receiver 400 comprises a mixer 420 which receives at a first input a RF signal 490 comprising a first frequency. The RF signal 490 is generated by a LO 470. At a second input, the mixer 420 is provided with a LO signal 411 from a signal generation unit 410. The LO signal 411 has a first signal component 411-1 which is related to the first frequency. For example, the frequency of the first signal component 411-1 is equal to the first frequency. The mixer 420 generates a (analog) baseband signal using the RF signal 490 and the LO signal 411.

The analog baseband receive signal is filtered by a low-pass filter 440 and converted to a digital signal by an ADC 450 in order to provide a digital baseband receive signal (e.g. in a Cartesian representation with an in-phase component I and a quadrature component Q).

Together with the LO signal 411, the mixer 420 receives an interfering signal 403. In some examples, the interfering signal 403 may occur at the input of the mixer 420 due to crosstalk from other components of the receiver or external components (e.g. the interfering signal may originate from a second LO signal for another mixer). In some examples, the interfering signal 403 may be an intermodulation product. The frequency of the interfering signal 403 may have a frequency offset $\Delta f$ from the frequency of the first signal component 411-1.

The interfering signal 403 may cause the mixer 420 to generate an undesired signal component in the baseband signal 402 in addition to a desired signal component generated by down-mixing the RF signal 490 using the first signal component 411-1 of the LO signal 411.

In order to prevent the generation of the undesired signal component, the signal generation unit 411 generates the LO signal 411 such that it comprises a compensation component 411-2 in addition to the first signal component 411-1. The compensation component 411-2 has a second frequency related to a frequency of the interfering signal 403. For example, the second frequency may be equal to the frequency of the interfering signal 403. That is, the frequency of the compensation component 411-2 may have the same frequency offset $\Delta f$ from the first frequency like the frequency of the interfering signal 403.

The signal generation unit 410 therefore comprises a LO 413 to generate a reference signal comprising the first frequency. Additionally, the signal generation unit 410 comprises a modulator 412 to modulate a phase and/or an amplitude of the reference signal with a (compensation) tone 415 comprising the frequency of the interfering signal 403 in order to generate a spurious sideband, i.e., the compensation component 411-2.

The compensation component may interfere with the interfering signal 403. For example, the compensation component may destructively interfere with the interfering signal 403, so that the mixer 420 may effectively receive only the first signal component 411-1 of the LO signal 411.

In order to adjust the phase and/or the amplitude of the compensation component 411-2, the signal generation unit 410 comprises an adjustment unit 414. The adjustment unit 414 adjusts the phase and/or the amplitude of the compensation component 411-2 based on a value of a signal characteristic of the baseband signal in a frequency range corresponding to the undesired signal component of the baseband signal.

The value of the signal characteristic of the baseband signal is provided by signal analysis unit 430, which analyses the digital baseband signal as generated by the ADC 450. For example, the signal characteristic may be the energy in the frequency range. The calculated value of the signal characteristic represents the resulting distortion component which is generated by the mixer 420. For example, the value of the signal characteristic may represent the sum of the baseband component 431 caused by the interfering signal 403 and the baseband component 432 caused by the compensation component 411-2. Accordingly, the value of the signal characteristic may be an indicator for the effective distortion that is received by the mixer 420 with the first component 411-1 of the LO signal 411. That is, the value of the signal characteristic may be an indicator for the degree of destructive interference between the interfering signal 403 and the compensation component 411-2 of the LO signal 411.

Based on the value of the signal characteristic, the adjustment unit 414 adjusts at least one of the amplitude and the phase of the second signal component 411-2. For example, the adjustment unit 414 may generate a control signal for the modulator 412 in order to control the modulation of the reference signal on the basis of the value of the signal characteristic. For example, the adjustment unit 414 may adjust the amplitude of the compensation component 411-2 to be equal to an amplitude of the interfering signal 403, and the phase of the compensation component 411-2 to be opposite to a phase of the interfering signal 403. The compensation component 411-2 may thus destructively interfere with interfering signal 403, so that the mixer 420 may effectively receive only the first signal component 411-1 of the LO signal 411. Thus, the distortion component in the baseband signal may be reduced or completely mitigated.

For example, the above processing may be carried out iteratively until the value of the signal characteristic is below a pre-defined threshold (i.e. fulfills a quality criterion).

Moreover, the receiver 400 illustrated in FIG. 4 may be configured to determine the frequency of the interfering signal 403. For example, the receiver 400 may carry out similar or equal processes as described for the receiver 300 illustrated in FIG. 3.

In other words, the required frequency of a compensation tone may be given by a frequency offset $\Delta f$ where the interfering tone is expected: $\Delta f = n \cdot LO1 - m \cdot LO2$. LO1 and LO2 may, e.g., be the configured carrier frequencies for CA and n and m may be integers. Critical frequency offsets may be calculated using firmware. Since the amplitude and the phase of the interfering tone are generally unknown, they may be estimated for correct cancellation. This may be done using the adaptive loop illustrated in FIG. 4. For the adaptation, TX modulation in a transceiver may be turned off, and an RF signal of the same frequency as LO1 may be applied at the second input of the mixer (for example, by feeding back the own TXPLL). With the compensation tone modulating LO1, the mixer may down-convert both the resulting spurious sideband and the interfering tone. Hence the sum of both tones may appear at the ADC output. An algorithm may then be used to adaptively tune the amplitude and/or phase of the compensation tone until both tones cancel at the ADC output and therefore also at the mixer input.

The receiver 400 may comprise one or more additional optional features corresponding to one or more aspects of the proposed concept or one or more examples described below.

In the foregoing description, it was assumed that only one transmit path is present in a transceiver. However, a transceiver may comprise multiple transmit paths which are connected to a duplexer (i.e. the transceiver provides multiple uplink paths). Accordingly, multiple RF transmit signals may leak into the RF signal provided to the receiver by the duplexer. Hence, a distortion component may be caused in a baseband receive signal which depends on multiple leaked RF transmit signals. Accordingly, a receiver for reducing a distortion component within a baseband receive signal according to the proposed concept may consider all or at least part of the multiple transmit signals for reducing the distortion component within the baseband receive signal. Additionally or alternatively, multiple interfering signals at the mixer of the receiver may be caused by multiple transmit paths or by additional receive paths comprised by the transceiver. Accordingly, a receiver for reducing a distortion component within a baseband receive signal according to the proposed concept may consider all or at least part of the multiple interfering signals. For example, a plurality of compensation components for the LO signal may be determined.

In other words, the proposed concept may also be applied when there are multiple sidebands (e.g. due to cross-talk causing phase modulation, or when multiple carriers are present in CA).

Figure 5A:
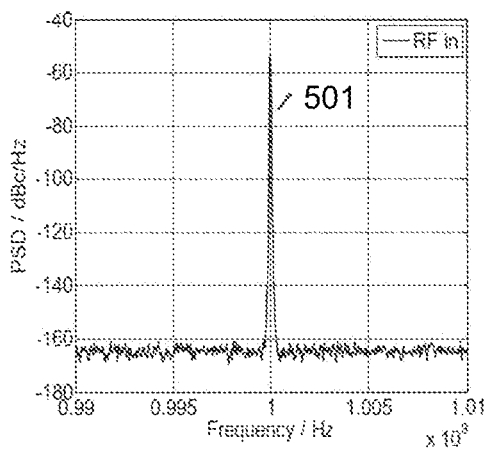
FIG. 5a illustrates an example of a radio frequency signal received by a mixer within a receiver.
Figure 5B:
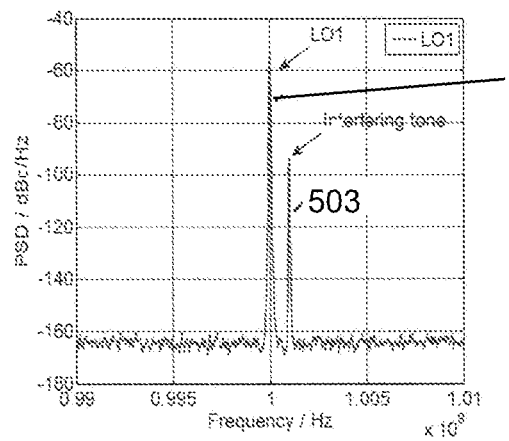
FIG. 5b illustrates an example of first signal component of a local oscillator signal and an example of an interfering signal received by the mixer.

In the following, examples of signals used in the examples described above are illustrated. FIG. 5a illustrates an example of a RF signal 501 received by a mixer within a receiver. The RF signal 501 has a peak at about 1 Giga-Hertz (GHz). FIG. 5b illustrates an example of first signal component 511-1 of a LO signal and an example of an interfering signal 503 received together by the mixer. The first signal component 511-1 comprises a peak at about 1 GHz, i.e., at a same or equal frequency as the frequency of the RF signal 501. The interfering signal 503 has a peak at a frequency at about 1.001 GHz, i.e., at a frequency close to the frequency of the signal component 511-1. Accordingly, the interfering signal 503 may cause the mixer to generate a distortion component in the baseband.

Figure 5C:
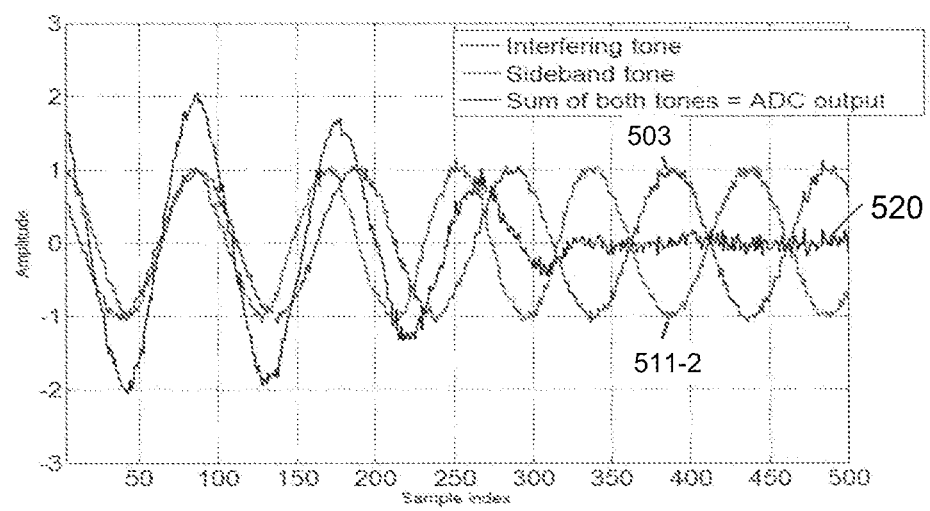
FIG. 5c illustrates an example of a relation between the interfering signal illustrated in FIG. 5b, a compensation component of the local oscillator signal and a baseband signal generated by the mixer.
Figure 5D:
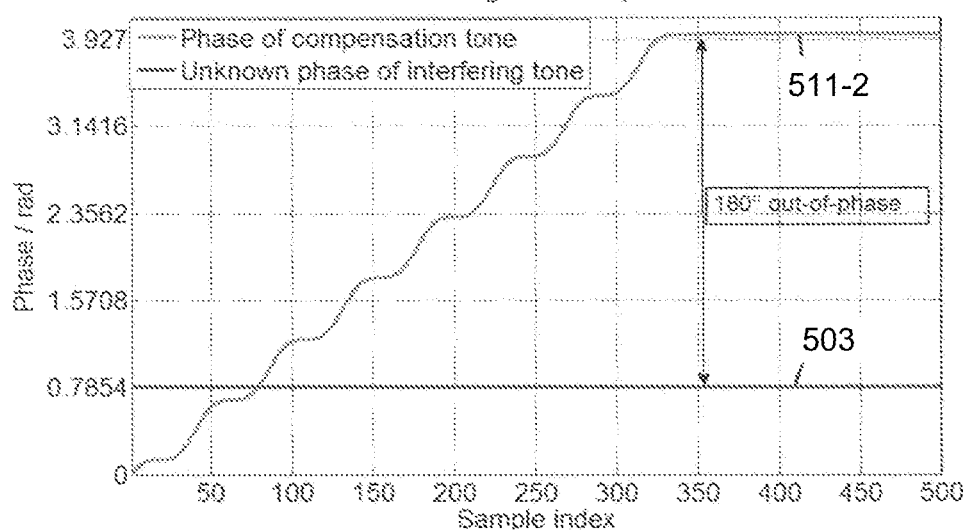
FIG. 5d illustrates an example of a phase relation between the interfering signal illustrated in FIG. 5b or FIG. 5c and the compensation component of the local oscillator signal illustrated in FIG. 5c.

FIG. 5c illustrates an example of a relation between the interfering signal 503 and a compensation component 511-2 of the LO signal. In FIG. 5c, an amplitude of the interfering signal 503 and the compensation signal 511-2 is substantially even. However, a phase difference between both signals varies with time (time is illustrated in terms of samples of an ADC). The variation of the phase difference between both signals is illustrated in FIG. 5d. As illustrated in FIG. 5d, the phase of the interfering signal is substantially constant, whereas the phase of the compensation component 511-2 is increased. As a result, the phase difference between both signals varies.

A result of the variation of the phase difference can be seen from the resulting baseband component 520 generated by the mixer using the compensation component 511-2 and the RF signal 501, while the interfering signal 503 is present at the input receiving the LO signal. The resulting baseband component 520 is highest at about sample 80, where the compensation component 511-2 and the interfering signal 503 have substantially the same phase, i.e. a phase difference of substantially zero. In other words, both signals interfere constructively and cause a maximum distortion in the baseband. For increasing samples, the phase difference increases and is opposite from about sample 330 on (see FIG. 5*d*). As illustrated in FIG. 5*c*, the amplitude of the resulting baseband component 520 decreases and is substantially zero for a phase difference of 180° between the compensation component 511-2 and the interfering signal 503. In other words, both signals interfere destructively and cause a minimum distortion in the baseband.

In other words, RF input, LO1 signal, and interfering tone due to LO2 may be shown in FIGS. 5*a* to 5*d*. LO1 may be modulated and the sum of interfering tone and spurious sideband tone may be received at an ADC output. Equal amplitude assumed, the phase of the compensation tone may be adaptively tuned until both tones are cancelled at the ADC output. If the phase of the compensation tones becomes 180° out-of-phase with interference tone, both tones may cancel at the mixer input, and the down-conversion of TX leakage may be prevented.

Figure 6:
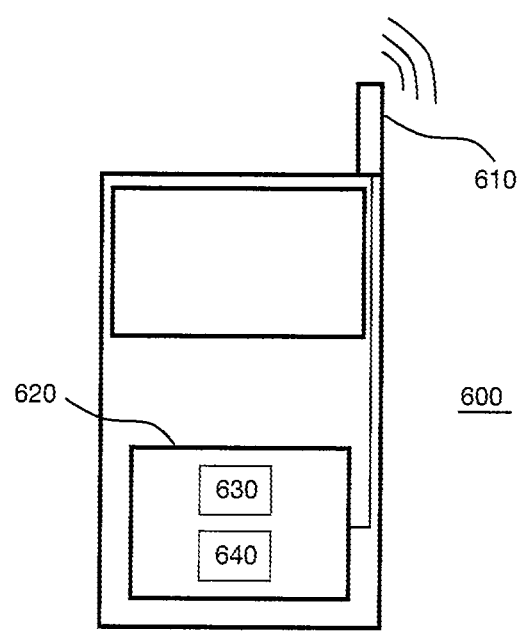
FIG. 6 illustrates an example of a mobile communications device comprising a receiver for reducing a distortion component within a baseband receive signal and/or a receiver for determining a compensation component for a local oscillator signal supplied to a mixer within the receiver.

An example of an implementation using distortion component reduction within a baseband receive signal according to one or more aspects of the proposed concept or one or more examples described above is illustrated in FIG. 6. FIG. 6 schematically illustrates an example of a mobile communications device or mobile phone or user equipment 600 comprising a receiver 630 for reducing a distortion component within a baseband receive signal according to an example described herein and/or a receiver 640 for determining a compensation component for a LO signal supplied to a mixer within the receiver according to an example described herein. The receiver 630 and/or the receiver 640 may be comprised in a transceiver 620 (e.g. according to an example described herein). Optionally, the transceiver 620 may further comprise a transmitter (not illustrated). The transmitter and the receiver 630 and/or the receiver 640 may be coupled to a duplexer (not illustrated). An antenna element 610 of the mobile communications device 600 may be coupled to the transceiver 620 (e.g. by means of a duplexer). To this end, mobile communications devices may be provided allowing improved signal reception characteristics.

Figure 7:
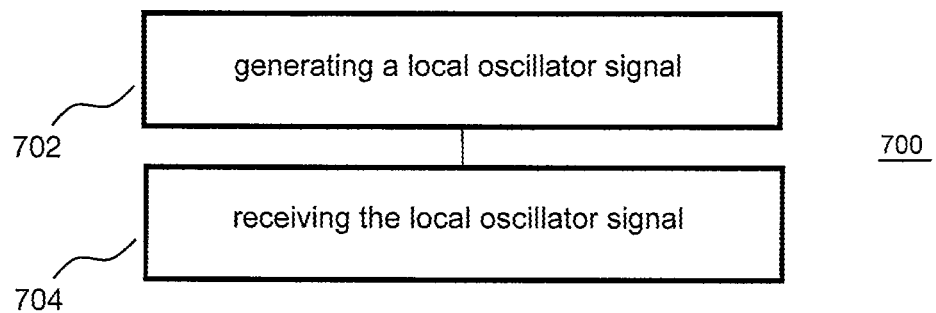
FIG. 7 illustrates a flowchart of an example of a method for reducing a distortion component within a baseband receive signal.

An example of a method 700 for reducing a distortion component within a baseband receive signal is illustrated by means of a flowchart in FIG. 7. The baseband receive signal is derived from a RF signal. The method comprises generating 702 a LO signal. The LO signal comprises a first signal component having a first frequency related to a desired signal component of the RF signal, and a second signal component having a second frequency related to a frequency of an interfering signal. The method further comprises receiving 704 the local oscillator signal by a mixer, wherein the mixer receives the local oscillator signal with the interfering signal.

More details and aspects of the method are mentioned in connection with the proposed concept or one or more examples described above (e.g. FIGS. 1-6). The method may comprise one or more additional optional features corresponding to one or more aspects of the proposed concept or one or more examples described above.

Figure 8:
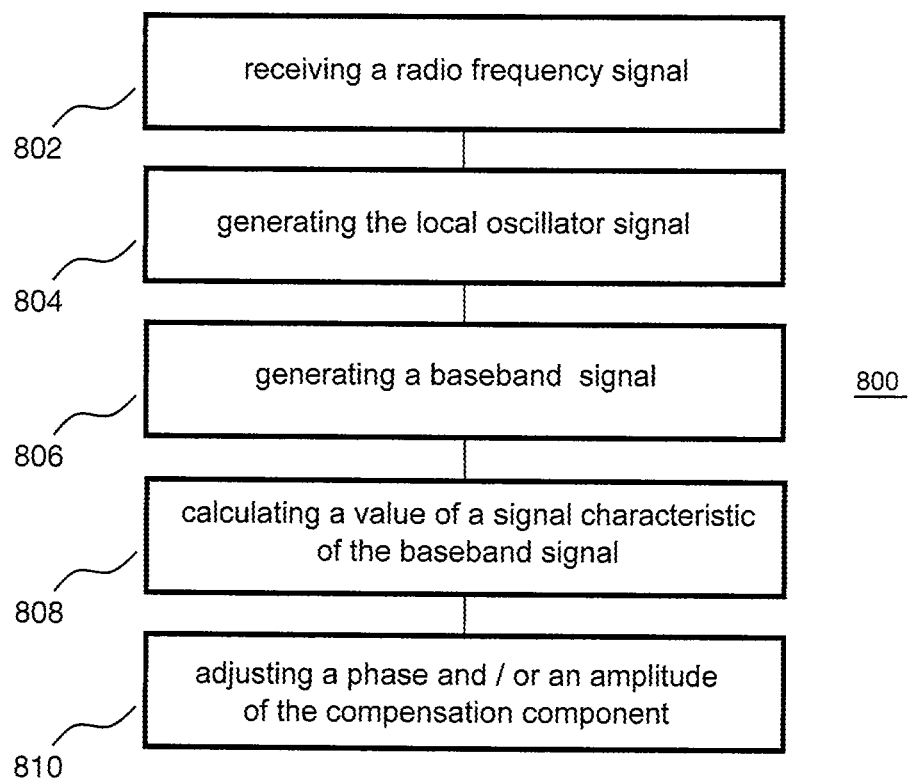
FIG. 8 illustrates a flowchart of an example of a method for determining a compensation component for a local oscillator signal supplied to a mixer within a receiver.

An example of a method 800 for determining a compensation component for a LO signal supplied to a mixer within a receiver is illustrated by means of a flowchart in FIG. 8. The mixer receives an interfering signal with the LO signal. The method comprises receiving 802 a RF signal having a first frequency by the mixer. Further, the method comprises generating 804 the LO signal. The LO signal comprises a first signal component having a frequency related to the first frequency, and the compensation component having a second frequency related to a frequency of the interfering signal. The method further comprises generating 806 a baseband signal by the mixer using the RF signal and the LO signal. Further, the method comprises calculating 808 a value of a signal characteristic of the baseband signal in a frequency range corresponding to an undesired signal component of the baseband signal. The method further comprises adjusting 810 a phase and/or an amplitude of the compensation component based on the value of the signal characteristic.

More details and aspects of the method are mentioned in connection with the proposed concept or one or more examples described above (e.g. FIGS. 1-6). The method may comprise one or more additional optional features corresponding to one or more aspects of the proposed concept or one or more examples described above.

In the following some examples are mentioned. Example 1 is a receiver for reducing a distortion component within a baseband receive signal derived from a radio frequency signal. The receiver comprises a signal generation unit configured to generate a local oscillator signal, the local oscillator signal comprising a first signal component having a first frequency related to a desired signal component of the radio frequency signal, and a second signal component having a second frequency related to a frequency of an interfering signal, and a mixer coupled to the signal generation unit and configured to receive the local oscillator signal, wherein the mixer is configured to receive the local oscillator signal with the interfering signal.

In example 2, the subject matter of example 1 can optionally include the distortion component being related to an undesired signal component of the radio frequency signal.

In example 3, the subject matter of example 1 can optionally include the undesired signal component being related to a radio frequency transmit signal.

In example 4, the subject matter of any one of examples 1-3 can optionally include the second frequency being equal to the frequency of the interfering signal.

In example 5, the subject matter of any one of examples 1-4 an amplitude of the second signal component being related to an amplitude of the interfering signal.

In example 6, the subject matter of example 5 can optionally include the amplitude of the second signal component being equal to the amplitude of the interfering signal.

In example 7, the subject matter of any one of examples 1-6 can optionally include a phase of the second signal component being related to a phase of the interfering signal.

In example 8, the subject matter of example 7 can optionally include the phase of the second signal component being opposite to the phase of the interfering signal.

In example 9, the subject matter of any one of examples 1-8 can optionally include the signal generation unit is configured to generate the local oscillator signal by modulating a reference signal comprising the first frequency with a reference tone, the reference tone comprising the frequency of the interfering signal.

In example 10, the subject matter of any one of examples 1-9 can optionally include the interfering signal is related to a second local oscillator signal for a second mixer.

In example 11, the subject matter of one of the previous examples can optionally include the mixer being configured to generate the baseband receive signal using the radio frequency signal and the local oscillator signal.

In example 12, the subject matter of one of the previous examples can optionally include the receiver being configured to determine the second signal component in a first mode of operation, in which the mixer is configured to receive an auxiliary radio frequency signal having the first frequency, and to generate an auxiliary baseband signal using the auxiliary radio frequency signal and the local oscillator signal, a signal analysis unit is configured to calculate a value of a signal characteristic of the auxiliary baseband signal in a frequency range corresponding to an undesired signal component of the auxiliary baseband signal and the signal generation unit is further configured to adjust a phase or an amplitude of the second signal component based on the value of the signal characteristic.

Example 13 is a receiver for determining a compensation component for a local oscillator signal supplied to a mixer within the receiver, wherein the mixer receives an interfering signal with the local oscillator signal, and wherein the mixer is configured to receive a radio frequency signal having a first frequency. The receiver comprises a signal generation unit configured to generate the local oscillator signal comprising a first signal component having a frequency related to the first frequency, and the compensation component having a second frequency related to a frequency of the interfering signal, wherein the mixer is configured to generate a baseband signal using the radio frequency signal and the local oscillator signal, a signal analysis unit configured to calculate a value of a signal characteristic of the baseband signal in a frequency range corresponding to an undesired signal component of the baseband signal and wherein the signal generation unit is further configured to adjust a phase or an amplitude of the compensation component based on the value of the signal characteristic.

In example 14, the subject matter of example 13 can optionally include the signal generation unit being configured to adapt the phase or the amplitude of the compensation component iteratively until the value of the signal characteristic satisfies a quality criterion.

In example 15, the subject matter of any one of examples 13-14 can optionally include the frequency of the first signal component being substantially equal to the first frequency.

In example 16, the subject matter of any one of examples 13-15 can optionally include the second frequency being substantially equal to the frequency of the interfering signal.

In example 17, the subject matter of any one of examples 13-16 can optionally include the signal generation unit being configured to generate the local oscillator signal by modulating a reference signal comprising the first frequency with a reference tone comprising the frequency of the interfering signal, and wherein the radio frequency signal is the reference signal.

In example 18, the subject matter of any one of examples 13-17 can optionally include the interfering signal being related to a second local oscillator signal for a second mixer.

In example 19, the subject matter of example 18 can optionally include the receiver being configured to determine the frequency of the interfering signal, wherein the signal analysis unit is configured to calculate a frequency of a potentially interfering signal according to an operation which is mathematically correspondent to $$f_{int} = f_{LO1} + (n \cdot f_{LO1} - m \cdot f_{LO2}),$$

with $f_{int}$ denoting the frequency of the potentially interfering signal, $f_{LO1}$ denoting the frequency of the first signal component, $f_{LO2}$ denoting the frequency of the second local oscillator signal, and n,m denoting integers, wherein the signal generation unit is configured to generate an auxiliary local oscillator signal comprising the first signal component, wherein the mixer is further configured to generate an auxiliary baseband signal using the radio frequency signal and the auxiliary local oscillator signal, wherein the signal analysis unit is further configured to calculate a value of the signal characteristic of the auxiliary baseband signal in a frequency range related to the frequency of the potentially interfering signal and wherein the signal analysis unit is further configured to decide that the frequency of the potentially interfering signal is the frequency of the interfering signal based on the value of the signal characteristic in the frequency range related to the frequency of the potentially interfering signal.

Example 20 is a transceiver comprising a receiver for reducing a distortion component within a baseband receive signal derived from a radio frequency signal according to one of the previous examples and/or a receiver for determining a compensation component for a local oscillator signal supplied to a mixer within the receiver according to one of the previous examples.

In example 21, the subject matter of example 20 can optionally include comprising a transmitter, wherein the transmitter and the receiver for reducing a distortion component within a baseband receive signal derived from a radio frequency signal and/or the receiver for determining a compensation component for a local oscillator signal supplied to a mixer within the receiver are coupled to a duplexer.

Example 22 is a mobile communications device comprising a transceiver according to example 20 or 21.

In example 23, the subject matter of example 22 can optionally include at least one antenna coupled to the transceiver.

Example 24 is a means for reducing a distortion component within a baseband receive signal derived from a radio frequency signal. The means comprise means for generating a local oscillator signal, the local oscillator signal comprising a first signal component having a first frequency related to a desired signal component of the radio frequency signal, and a second signal component having a second frequency related to a frequency of an interfering signal and means for receiving the local oscillator signal, wherein the means for receiving is coupled to the means for generating the local oscillator signal, and wherein the means for receiving receives the interfering signal with the local oscillator signal.

In example 25, the subject matter of example 24 can optionally include the second frequency being equal to the frequency of the interfering signal.

Example 26 is a means for determining a compensation component for a local oscillator signal supplied to a mixer within a receiver, wherein the mixer receives an interfering signal with the local oscillator signal, and wherein the mixer is configured to receive a radio frequency signal having a first frequency. The means comprise means for generating the local oscillator signal comprising a first signal component having a frequency related to the first frequency, and the compensation component having a second frequency related to a frequency of the interfering signal, wherein the mixer is configured to generate a baseband signal using the radio frequency signal and the local oscillator signal, a means for calculating a value of a signal characteristic of the baseband signal in a frequency range corresponding to an undesired signal component of the baseband signal and wherein the means for generating the local oscillator signal is configured to adjust a phase or an amplitude of the compensation component based on the value of the signal characteristic.

In example 27, the subject matter of example 26 can optionally include the means for generating the local oscillator signal being configured to adapt the phase or the amplitude of the compensation component iteratively until the value of the signal characteristic satisfies a quality criterion.

Example 28 is a method for reducing a distortion component within a baseband receive signal derived from a radio frequency signal. The method comprises generating a local oscillator signal, the local oscillator signal comprising a first signal component having a first frequency related to a desired signal component of the radio frequency signal, and a second signal component having a second frequency related to a frequency of an interfering signal and receiving the local oscillator signal by a mixer, wherein the mixer receives the local oscillator signal with the interfering signal.

In example 29, the subject matter of example 28 can optionally include the distortion component being related to an undesired signal component of the radio frequency signal.

In example 30, the subject matter of example 29 can optionally include the undesired signal component being related to a radio frequency transmit signal.

In example 31, the subject matter of any one of examples 28-30 can optionally include the second frequency being equal to the frequency of the interfering signal.

In example 32, the subject matter of any one of examples 28-31 can optionally include an amplitude of the second signal component being related to an amplitude of the interfering signal.

In example 33, the subject matter of example 32 can optionally include the amplitude of the second signal component being equal to the amplitude of the interfering signal.

In example 34, the subject matter of any one of examples 28-33 can optionally include a phase of the second signal component being related to a phase of the interfering signal.

In example 35, the subject matter of example 34 can optionally include the phase of the second signal component being opposite to the phase of the interfering signal.

In example 36, the subject matter of one of the previous examples can optionally include generating the local oscillator signal comprising modulating a reference signal comprising the first frequency with a reference tone, the reference tone comprising the frequency of the interfering signal.

In example 37, the subject matter of one of the previous examples can optionally include the interfering signal being related to a second local oscillator signal for a second mixer.

In example 38, the subject matter of one of the previous examples can optionally include the method further comprising generating the baseband receive signal by the mixer using the radio frequency signal and the local oscillator signal.

Example 39 is a method for determining a compensation component for a local oscillator signal supplied to a mixer within a receiver, the mixer receiving an interfering signal with the local oscillator signal. The method comprises receiving a radio frequency signal having a first frequency by the mixer, generating the local oscillator signal comprising a first signal component having a frequency related to the first frequency, and the compensation component having a second frequency related to a frequency of the interfering signal, generating a baseband signal by the mixer using the radio frequency signal and the local oscillator signal, calculating a value of a signal characteristic of the baseband signal in a frequency range corresponding to an undesired signal component of the baseband signal and adjusting a phase or an amplitude of the compensation component based on the value of the signal characteristic.

In example 40, the subject matter of example 39 can optionally include adapting the phase or the amplitude of the compensation component being carried out iteratively until the value of the signal characteristic satisfies a quality criterion.

In example 41, the subject matter of example 39 or 40 can optionally include the frequency of the first signal component being substantially equal to the first frequency.

In example 42, the subject matter of any one of examples 39-41 can optionally include the second frequency being substantially equal to the frequency of the interfering signal.

In example 43, the subject matter of any one of examples 39-42 can optionally include generating the local oscillator signal comprising modulating a reference signal comprising the first frequency with a reference tone comprising the frequency of the interfering signal, and wherein the radio frequency signal is the reference signal.

In example 44, the subject matter of any one of examples 39-43 can optionally include the interfering signal being related to a second local oscillator signal for a second mixer.

In example 45, the subject matter of example 44 can optionally include determining the frequency of the interfering signal. The determining comprises calculating a frequency of a potentially interfering signal according to an operation which is mathematically correspondent to $$f_{int} = f_{LO1} + (n \cdot f_{LO1} - m \cdot f_{LO2}),$$

with $f_{int}$ denoting the frequency of the potentially interfering signal, $f_{LO1}$ denoting the frequency of the first signal component, $f_{LO2}$ denoting the frequency of the second local oscillator signal, and n,m denoting integers, generating an auxiliary local oscillator signal comprising the first signal component, generating an auxiliary baseband signal by the mixer using the radio frequency signal and the auxiliary local oscillator signal, calculating a value of the signal characteristic of the auxiliary baseband signal in a frequency range related to the frequency of the potentially interfering signal and deciding that the frequency of the potentially interfering signal is the frequency of the interfering signal based on the value of the signal characteristic in the frequency range related to the frequency of the potentially interfering signal.

Example 46 is a computer readable storage medium having stored thereon a program having a program code for performing the method of any of examples 28 to 45, when the program is executed on a computer or processor.

Example 47 is a computer program having a program code configured to perform the method of any of examples 28 to 45, when the computer program is executed on a computer or processor.

Examples may further provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

What is claimed is:

1. A receiver for reducing a distortion component within a baseband receive signal derived from a radio frequency signal, comprising:
    a signal generation unit configured to generate a local oscillator signal, the local oscillator signal comprising a first signal component having a first frequency related to a desired signal component of the radio frequency signal, and a second signal component having a second frequency related to a frequency of an interfering signal; and
    a mixer coupled to the signal generation unit and configured to receive the radio frequency signal at a first input of the mixer and receive the local oscillator signal at a second input of the mixer, wherein the interfering signal is coupled to the second input of the mixer.

2. The receiver of claim 1, wherein the distortion component is related to an undesired signal component of the radio frequency signal.

3. The receiver of claim 2, wherein the undesired signal component is related to a radio frequency transmit signal.

4. The receiver of claim 1, wherein the second frequency is equal to the frequency of the interfering signal.

5. The receiver of claim 1, wherein an amplitude of the second signal component is related to an amplitude of the interfering signal.

6. The receiver of claim 5, wherein the amplitude of the second signal component is equal to the amplitude of the interfering signal.

7. The receiver of claim 1, wherein a phase of the second signal component is related to a phase of the interfering signal.

8. The receiver of claim 7, wherein the phase of the second signal component is opposite to the phase of the interfering signal.

9. The receiver of claim 1, wherein the signal generation unit is configured to generate the local oscillator signal by modulating a reference signal comprising the first frequency with a reference tone, the reference tone comprising the frequency of the interfering signal.

10. The receiver of claim 1, wherein the interfering signal is related to a second local oscillator signal for a second mixer.

11. The receiver of claim 1, wherein the mixer is configured to generate the baseband receive signal using the radio frequency signal and the local oscillator signal.

12. The receiver of claim 1, wherein the receiver is configured to determine the second signal component in a first mode of operation, in which:
the mixer is configured to receive an auxiliary radio frequency signal having the first frequency, and to generate an auxiliary baseband signal using the auxiliary radio frequency signal and the local oscillator signal;
a signal analysis unit is configured to calculate a value of a signal characteristic of the auxiliary baseband signal in a frequency range corresponding to an undesired signal component of the auxiliary baseband signal; and
the signal generation unit is further configured to adjust a phase or an amplitude of the second signal component based on the value of the signal characteristic.

13. A receiver for determining a compensation component for a local oscillator signal supplied to a mixer within the receiver, wherein the mixer is configured to receive a radio frequency signal having a first frequency at a first input of the mixer and receive an interfering signal with the local oscillator signal at a second input of the mixer, comprising:
a signal generation unit configured to generate the local oscillator signal comprising a first signal component having a frequency related to the first frequency, and the compensation component having a second frequency related to a frequency of the interfering signal;
wherein the mixer is configured to generate a baseband signal using the radio frequency signal and the local oscillator signal;
a signal analysis unit configured to calculate a value of a signal characteristic of the baseband signal in a frequency range corresponding to an undesired signal component of the baseband signal; and
wherein the signal generation unit is further configured to adjust a phase or an amplitude of the compensation component based on the value of the signal characteristic.

14. The receiver of claim 13, wherein the signal generation unit is configured to adapt the phase or the amplitude of the compensation component iteratively until the value of the signal characteristic satisfies a quality criterion.

15. The receiver of claim 13, wherein the frequency of the first signal component is substantially equal to the first frequency.

16. The receiver of claim 13, wherein the second frequency is substantially equal to the frequency of the interfering signal.

17. The receiver of claim 13, wherein the signal generation unit is configured to generate the local oscillator signal by modulating a reference signal comprising the first frequency with a reference tone comprising the frequency of the interfering signal, and wherein the radio frequency signal is the reference signal.

18. The receiver of claim 13, wherein the interfering signal is related to a second local oscillator signal for a second mixer.

19. The receiver of claim 18, wherein the receiver is configured to determine the frequency of the interfering signal, wherein the signal analysis unit is configured to calculate a frequency of a potentially interfering signal according to an operation which is mathematically correspondent to $$f_{int}=f_{LO1}+(n \cdot f_{LO1}-m \cdot f_{LO2}),$$

with $f_{int}$ denoting the frequency of the potentially interfering signal, $f_{LO1}$ denoting the frequency of the first signal component, $f_{LO2}$ denoting the frequency of the second local oscillator signal, and n, m denoting integers;
wherein the signal generation unit is configured to generate an auxiliary local oscillator signal comprising the first signal component;
wherein the mixer is further configured to generate an auxiliary baseband signal using the radio frequency signal and the auxiliary local oscillator signal;
wherein the signal analysis unit is further configured to calculate a value of the signal characteristic of the auxiliary baseband signal in a frequency range related to the frequency of the potentially interfering signal; and
wherein the signal analysis unit is further configured to decide that the frequency of the potentially interfering signal is the frequency of the interfering signal based on the value of the signal characteristic in the frequency range related to the frequency of the potentially interfering signal.

20. A method for reducing a distortion component within a baseband receive signal derived from a radio frequency signal, comprising:
generating a local oscillator signal, the local oscillator signal comprising a first signal component having a first frequency related to a desired signal component of the radio frequency signal, and a second signal component having a second frequency related to a frequency of an interfering signal; and
receiving the radio frequency signal at a first input of a mixer and receiving the local oscillator signal at a second input of the mixer, wherein the interfering signal is coupled to the second input of the mixer.

21. A method for determining a compensation component for a local oscillator signal supplied to a mixer within a receiver, comprising:
receiving a radio frequency signal having a first frequency at a first input of the mixer and receiving an interfering signal with the local oscillator signal at a second input of the mixer;
generating the local oscillator signal comprising a first signal component having a frequency related to the first frequency, and the compensation component having a second frequency related to a frequency of the interfering signal;
generating a baseband signal by the mixer using the radio frequency signal and the local oscillator signal;
calculating a value of a signal characteristic of the baseband signal in a frequency range corresponding to an undesired signal component of the baseband signal; and
adjusting a phase or an amplitude of the compensation component based on the value of the signal characteristic.

* * * * *